(12) United States Patent
Park (10) Patent No.: US 8,618,571 B2
(45) Date of Patent: *Dec. 31, 2013

(54) SEMICONDUCTOR LIGHT EMITTING DEVICE HAVING A REFLECTIVE LAYER

(75) Inventor: Hyung Jo Park, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/560,812

(22) Filed: Jul. 27, 2012

(65) Prior Publication Data

US 2012/0286316 A1 Nov. 15, 2012

Related U.S. Application Data

(63) Continuation of application No. 12/743,197, filed on May 14, 2010, now Pat. No. 8,253,156.

(30) Foreign Application Priority Data

Nov. 26, 2007 (KR) ................ 10-2007-0120649

(51) Int. Cl.
*H01L 33/00* (2010.01)

(52) U.S. Cl.
USPC .................................. 257/98; 257/E33.033

(58) Field of Classification Search
USPC ..................................... 257/98, 96
See application file for complete search history.

(56) References Cited

U.S. PATENT DOCUMENTS

| | | | |
|---|---|---|---|
| 5,005,057 A | 4/1991 | Izumiya et al. | |
| 5,793,062 A | 8/1998 | Kish, Jr. et al. | |
| 5,874,747 A | 2/1999 | Redwing et al. | |
| 6,420,199 B1 | 7/2002 | Coman et al. | |
| 6,900,473 B2 | 5/2005 | Yoshitake et al. | |
| 7,483,466 B2 | 1/2009 | Uchida et al. | |
| 7,518,153 B2 | 4/2009 | Usuda et al. | |
| 7,648,849 B2 | 1/2010 | Lee et al. | |
| 7,884,383 B2 | 2/2011 | Wirth | |

(Continued)

FOREIGN PATENT DOCUMENTS

| | | |
|---|---|---|
| EP | 0 430 041 A1 | 6/1991 |
| EP | 0 579 897 A1 | 1/1994 |

(Continued)

OTHER PUBLICATIONS

WO 2007/123355 A1 has been attached.*

(Continued)

*Primary Examiner* — Bilkis Jahan
(74) *Attorney, Agent, or Firm* — Birch, Stewart, Kolasch & Birch, LLP (57) ABSTRACT

Disclosed are a semiconductor light emitting device. The semiconductor light emitting device comprises a light emitting structure including a first conductive semiconductor layer, a second conductive semiconductor layer, and an active; an electrode on a first region of the first conductive semiconductor layer; a conductive support member under the light emitting structure; a metal layer between the light emitting structure and the conductive support member; and a reflective layer between the metal layer and the light emitting structure, wherein the metal layer is physically contacted with a lower surface of the reflective layer, wherein the reflective layer includes a first layer and a second layer, wherein the first layer has a different material from the second layer, wherein the metal layer has a protrusion, wherein the first conductive semiconductor layer includes a roughness.

20 Claims, 5 Drawing Sheets

(56) References Cited

U.S. PATENT DOCUMENTS

| | | |
|---|---|---|
| 8,049,235 B2 | 11/2011 | Nakahara |
| 8,120,041 B2 | 2/2012 | Watanabe |
| 8,253,156 B2 * | 8/2012 | Park ............................... 257/98 |
| 2001/0050376 A1 | 12/2001 | Shibata et al. |
| 2003/0111667 A1 | 6/2003 | Schubert |
| 2004/0104395 A1 | 6/2004 | Hagimoto et al. |
| 2005/0242365 A1 | 11/2005 | Yoo |
| 2006/0033113 A1 | 2/2006 | Lee et al. |
| 2006/0124956 A1 | 6/2006 | Peng |
| 2006/0192211 A1 | 8/2006 | Kako et al. |
| 2006/0202219 A1 | 9/2006 | Ohashi et al. |
| 2007/0001183 A1 | 1/2007 | Chen |
| 2007/0081571 A1 | 4/2007 | Wirth |
| 2007/0114545 A1 | 5/2007 | Jang et al. |
| 2007/0263687 A1 | 11/2007 | Takahashi et al. |
| 2008/0116471 A1 * | 5/2008 | Watanabe ....................... 257/98 |
| 2008/0197369 A1 | 8/2008 | Batres et al. |
| 2008/0296595 A1 | 12/2008 | Chu |
| 2009/0267092 A1 | 10/2009 | Fukshima et al. |
| 2009/0278150 A1 * | 11/2009 | Lee et al. ....................... 257/98 |
| 2010/0200881 A1 | 8/2010 | Masaki |

FOREIGN PATENT DOCUMENTS

| | | |
|---|---|---|
| EP | 1 770 792 A1 | 4/2007 |
| JP | 2002-111057 A | 4/2002 |
| JP | 2005-513787 A | 5/2005 |
| JP | 2006-54420 A | 2/2006 |
| JP | 2007-96327 A | 4/2007 |
| JP | 2007-200995 A | 8/2007 |
| JP | 2007-207981 A | 8/2007 |
| JP | 2008-130663 A | 6/2008 |
| JP | 2008-205475 A | 9/2008 |
| KR | 10-2000-0076604 A | 12/2000 |
| KR | 10-2002-0081947 A | 10/2002 |
| KR | 10-2003-0001326 A | 1/2003 |
| KR | 10-2007-0031351 A | 3/2007 |
| WO | WO 2006/131316 A1 | 12/2006 |
| WO | WO 2007/105626 A1 | 9/2007 |

OTHER PUBLICATIONS

English translation of KR 10-2002-0081947.
English translation of JP 2007-207981.
English-language Translation of KR 2007-0031351.

* cited by examiner

SEMICONDUCTOR LIGHT EMITTING DEVICE HAVING A REFLECTIVE LAYER

CROSS-REFERENCE TO RELATED APPLICATIONS

The present application is a continuation of U.S. patent application Ser. No. 13/506,812, filed Jul. 27, 2012, which is continuation of U.S. patent application Ser. No. 12/743,197, filed Nov. 25, 2008, now U.S. Pat. No. 8,253,156, which claims priority under 35 U.S.C. 119 to Korean Patent Application No. 10-2007-0120649 (filed on Nov. 26, 2007), which is hereby incorporated by reference in its entirety.

TECHNICAL FIELD

The present disclosure relates to a semiconductor light emitting device.

BACKGROUND ART

III-V group nitride semiconductors have been variously applied to an optical device such as blue and green LEDs (Light Emitting Diodes), a high speed switching device, such as a MOSFET (Metal Semiconductor Field Effect Transistor) and an HEMT (Hetero junction Field Effect Transistors), and a light source of a lighting device or a display device. Particularly, a light emitting device using the group III nitride semiconductor has a direct transition-type bandgap corresponding to the range of visible rays to ultraviolet rays, and can perform high efficient light emission.

A nitride semiconductor is mainly used for the LED or an LD (laser diode), and studies have been continuously conducted to improve the manufacturing process or the light efficiency of the nitride semiconductor.

DISCLOSURE

Technical Problem

The embodiment provides a semiconductor light emitting device comprising a reflective layer, in which mediums comprising different refractive indexes are alternately stacked.

The embodiment provides a semiconductor light emitting device capable of adjusting the thickness of mediums and the number of pairs of the mediums in a reflective layer according to wavelength of emitted light.

The embodiment provides a semiconductor light emitting device comprising a reflective layer and an ohmic layer stacked under a light emitting structure.

Technical Solution

An embodiment provides a semiconductor light emitting device comprising: a light emitting structure comprising a III-V group compound semiconductor layer; a reflective layer comprising mediums, which are different from each other and alternately stacked under the light emitting structure; and a second electrode layer under the reflective layer.

An embodiment provides a semiconductor light emitting device comprising: a semiconductor light emitting device comprising: a light emitting structure comprising a first conductive semiconductor layer, an active layer under the first conductive semiconductor layer, and a second conductive semiconductor layer under the active layer; a reflective layer comprising a first medium having a first refractive index and a second medium having a second refractive index under the light emitting structure; and a second electrode layer under the reflective layer.

Advantageous Effects

The embodiment can improve reflection characteristics by adopting a reflective layer having a DBR (Distributed Bragg Reflector) structure.

The embodiment can improve external light-emitting efficiency using a reflective layer under an active layer.

The embodiment can maintain high reflection characteristics by adjusting the thickness of each medium in a reflective layer according to wavelength of emitted light.

BEST MODE

A semiconductor light emitting device according to an embodiment will be described in detail with reference to the accompanying drawings. In the description of the embodiment, the term "on" or "under" of each layer will be described with reference to the accompanying drawings and thickness of each layer is not limited to thickness shown in the drawings.

Figure 1:
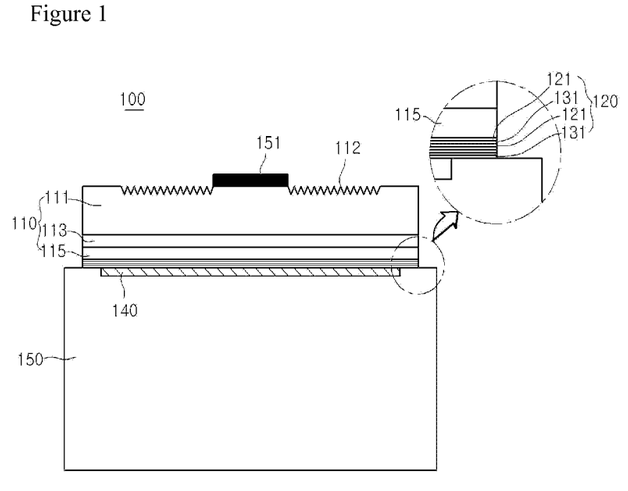
FIG. 1 is a side sectional view illustrating a semiconductor light emitting device according to a first embodiment.

FIG. 1 is a side sectional view illustrating a semiconductor light emitting device according to a first embodiment.

Referring to FIG. 1, the semiconductor light emitting device 100 comprises a light emitting structure 110, a reflective layer 120, an ohmic layer 140 and a conductive support member 150.

The light emitting structure 110 comprises a first conductive semiconductor layer 111, a second conductive semiconductor layer 115, and an active layer 113 interposed between the first and second conductive semiconductor layers 111 and 115.

The first conductive semiconductor layer 111 can be prepared in the form of at least one semiconductor layer doped with a first conductive dopant. The semiconductor layer is a III-V group compound semiconductor and may comprise at least one selected from the group consisting of GaN, InN, AlN, InGaN, AlGaN, InAlGaN and AlInN. When the first conductive semiconductor layer 111 is an N type semiconductor layer, the first conductive dopant comprises an N type dopant such as Si, Ge, Sn, Se and Te.

A first electrode 151 having a predetermined pattern is formed on the upper surface of the first conductive semiconductor layer 111. Roughness 112 may be formed on a part of the upper surface of the first conductive semiconductor layer 111, or the entire surface of the first conductive semiconductor layer 111.

The active layer 113 is formed under the first conductive semiconductor layer 111. The active layer 113 has a single quantum well structure or a multi-quantum well structure.

The active layer 113 is formed with the arrangement of a well layer and a barrier layer by using III-V group compound semiconductor materials. For example, the active layer 113 may be formed with the arrangement of an InGaN well layer/a GaN barrier layer or an AlGaN well layer/a GaN barrier layer.

The active layer 113 comprises material having bandgap energy according to wavelength of emitted light. For example, in the case of blue light having wavelength of 460 nm to 470 nm, the active layer 113 may have a single quantum well structure or a multi-quantum well structure at one cycle of an InGaN well layer/a GaN barrier layer. The active layer 113 may comprise material that emits chromatic light such as blue light, red light and green light.

A conductive clad layer may be formed on and/or under the active layer 113. The conductive clad layer can be prepared in the form of an AlGaN layer.

The second conductive semiconductor layer 115 is formed under the active layer 113. The second conductive semiconductor layer 115 can be prepared in the form of at least one semiconductor layer doped with a second conductive dopant. The semiconductor layer is a III-V group compound semiconductor and may comprise at least one selected from the group consisting of GaN, InN, AlN, InGaN, AlGaN, InAlGaN and AlInN. When the second conductive semiconductor layer 115 is a P type semiconductor layer, the second conductive dopant comprises a P type dopant such as Mg, Zn, Ca, Sr and Ba.

A third conductive semiconductor layer (not shown) can be formed under the second conductive semiconductor layer 115. When the first conductive semiconductor layer 111 is a N type semiconductor layer, the second conductive semiconductor layer 115 can be prepared in the form of an P type semiconductor layer. The third conductive semiconductor layer can be prepared in the form of a semiconductor layer doped with the N type dopant. The light emitting structure 110 may comprise at least one of an N-P junction structure, a P-N junction structure, an N-P-N junction structure and a P-N-P junction structure.

The reflective layer 120 is formed under the light emitting structure 110. The reflective layer 120 is formed under the second conductive semiconductor layer 115 and comprises a DBR structure in which different mediums 121 and 131 are alternately stacked. In the DBR structure, several pairs of two transparent mediums 121 and 131 having different refractive indexes are alternately stacked.

In the reflective layer 120, the first medium 121 and the second medium 131 stacked under the first medium 121 forms one pair, and the number of pairs of the first medium 121 and the second medium 131 may be 10 to 30.

The first medium 121 and the second medium 131 in the reflective layer 120 may use two materials representing large difference between refractive indexes thereof among III-V group compound semiconductors. The first medium 121 may comprise an AlN layer and the second medium 131 may comprise a GaN layer. In the reflective layer 120, AlN/GaN pairs are alternately stacked. In addition, GaN/AlN pairs are alternately stacked in the reflective layer 120. The first medium 121 or the second medium 131 may comprise one selected from the group consisting of InN, InGaN, AlGaN, InAlGaN and AlInN. Further, another semiconductor layer, such as InN, InGaN, AlGaN, InAlGaN and AlInN, can be inserted between the first medium 121 and the second medium 131.

In each pair structure provided in the reflective layer 120, the first medium 121 may have thickness of 35 nm to 80 nm and the second medium 131 may have thickness of 30 nm to 75 nm. Further, the first medium 121 may have thickness different from that of the second medium 131, and the first medium 121 and the second medium 131 may be formed with the same thickness.

The thickness of the first medium 121 and the second medium 131 in the reflective layer 120 can be calculated using wavelength of emitted light in the active layer 113 and refractive indexes of the first medium 121 and the second medium 131 as expressed by the following Equation 1.

$$T=\lambda/(4n) \quad \text{[Equation 1]}$$

In Equation 1, T denotes thickness of each medium, $\lambda$ denotes wavelength and n denotes a refractive index of each medium.

When the wavelength is 450 nm, if the AlN layer has a refractive index of 2.12, the AlN layer may have thickness of 53.1 nm. If the GaN layer has a refractive index of 2.44, the GaN layer may have thickness of 46.1 nm.

In the reflective layer 120, thickness of the first medium 121 and the second medium 131 can be optimized according to the wavelength of emitted light. The lowermost medium of the reflective layer 120 may not have a pair structure.

Figure 12:
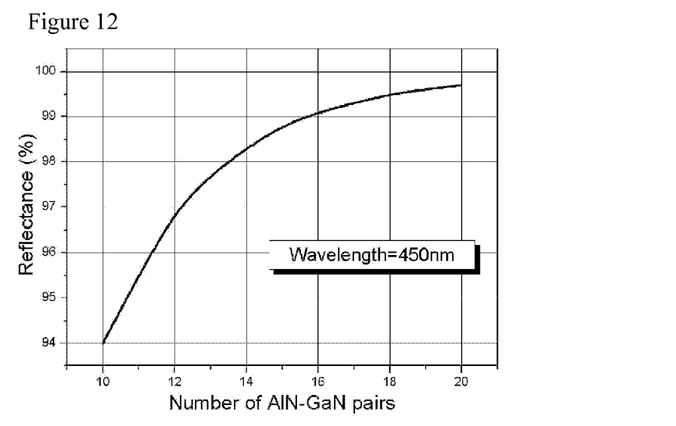
FIG. 12 is a graph illustrating reflectance according to the number of AlN—GaN pairs in a reflective layer according to a first embodiment.

Referring to FIG. 12, in a case in which the wavelength of emitted light is 450 nm, if the number of AlN—GaN pairs in the reflective layer 120 is larger than 10, the reflective layer 120 has reflectance larger than 40%. If the number of AlN—GaN pairs is larger than 11, the reflective layer 120 has reflectance of 95% to 99%. Accordingly, if the number of AlN—GaN pairs is larger than 10, the reflective layer 120 has higher reflectance.

The thickness of the mediums and the number of pairs of the mediums in the reflective layer 120 may vary depending on the wavelength of emitted light. For example, the reflective layer 120 can efficiently reflect light having wavelength of 300 nm to 700 nm.

The reflective layer 120 may be formed a size identical to a light emitting area of the active layer 113, so that the reflection characteristics can be maximized and external light-emitting efficiency can be improved.

Also, the reflective layer 120 can be formed with a high-conductivity material and used as a part of the light emitting device.

The ohmic layer 140 is formed under the reflective layer 120 and the conductive support member 150 is formed under the ohmic layer 140. The ohmic layer 140 and the conductive support member 150 serve as a second electrode layer.

The ohmic layer 140 may comprise material having superior ohmic characteristics and low transmittance to reduce difference in resistance between the reflective layer 120 and the conductive support member 150. For example, the ohmic layer 140 may comprise at least one selected from the group consisting of Pt, Ni, Au, Rh and Pd or a mixture thereof. The ohmic layer 140 may not be exposed to the outer wall of a device.

The conductive support member 150 may comprise copper, gold, carrier wafer (e.g. Si, Ge, GaAs, ZnO, or SiC) and the like. For example, the conductive support member 150 can be formed using plating or wafer bonding technology. The scope of the present invention is not limited thereto.

FIGS. 2 to 10 are side sectional view illustrating the method of fabricating the semiconductor light emitting device according to the first embodiment.

Figure 2:
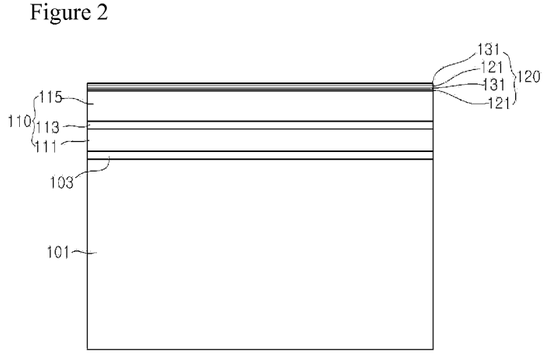
FIGS. 2 to 10 are side sectional view illustrating the method of fabricating the semiconductor light emitting device according to the first embodiment.

Referring to FIG. 2, a buffer layer 103 is formed on a substrate 101. The substrate 101 may comprise material selected from the group consisting of $Al_2O_3$, GaN, SiC, ZnO, Si, GaP, InP and GaAs.

The buffer layer 103 may comprise a III-V group compound semiconductor. For example, the buffer layer 103 may comprise one selected from the group consisting of GaN, InN, AlN, InGaN, AlGaN, InAlGaN and AlInN. The buffer layer 103 may be doped with a conductive dopant, or may not be formed.

An undoped semiconductor layer (not shown) may be formed on the buffer layer 103 and may serve as a seed layer for growth of a nitride semiconductor. At least one of the buffer layer 103 and the undoped semiconductor layer may be formed or not. The scope of the present invention is not limited thereto.

The first conductive semiconductor layer 111 is formed on the buffer layer 103, the active layer 113 is formed on the first conductive semiconductor layer 111, and the second conductive semiconductor layer 115 is formed on the active layer 113.

The conductive clad layer may be formed on and/or under the active layer 113. The conductive clad layer may comprise the AlGaN layer.

A light emitting structure 110 comprises the first conductive semiconductor layer 111, the active layer 113 and the second conductive semiconductor layer 115. Another layer can be added thereto or can be inserted there between within the scope of the embodiment. The scope of the present invention is not limited to such a structure.

The reflective layer 120 is formed on the second conductive semiconductor layer 115. The reflective layer 120 can be formed using a deposition method such as an MOCVD (Metal Organic Chemical Vapor Deposition), an MBE (Molecular Beam Epitaxy) or a HVPE (hydride Vapor Phase Epitaxy).

The reflective layer 120 comprises the first medium 121 and the second medium 131. In detail, the first medium 121 is formed on the second conductive semiconductor layer 115 and the second medium 131 is formed on the first medium 121. The first medium 121 and the second medium 131, which are prepared as a pair, can be alternately stacked to form the DBR structure. The number of the pairs may be 10 to 30.

The first medium 121 and the second medium 131 may use two materials representing large difference between refractive indexes thereof. The first medium 121 in the reflective layer 120 may comprise the AlN layer and the second medium 131 may comprise the GaN layer. The reflective layer 120 may comprise the AlN—GaN pair or the GaN—AlN pair. The first medium 121 or the second medium 131 may comprise one selected from the group consisting of InN, InGaN, AlGaN, InAlGaN and AlInN. Further, another semiconductor layer, such as InN, InGaN, AlGaN, InAlGaN and AlInN, can be inserted between the first medium 121 and the second medium 131.

The first medium 121 may have thickness of 35 nm to 80 nm and the second medium 131 may have thickness of 30 nm to 75 nm. Further, the first medium 121 may have thickness different from that of the second medium 131, and the first medium 121 and the second medium 131 may be formed with the same thickness.

The thickness of the first medium 121 and the second medium 131 and the number of pairs of the first medium 121 and the second medium 131 in the reflective layer 120 may vary depending on the wavelength of emitted light. For example, when the wavelength of emitted light is 450 nm, if the AlN layer has a refractive index of 2.12, the AlN layer may have thickness of 53.1 nm. If the GaN layer has a refractive index of 2.44, the GaN layer may have thickness of 46.1 nm.

The thickness of the first medium 121 and the second medium 131 can be calculated based on the wavelength of emitted light, and the number of pairs of the first medium 121 and the second medium 131 can be selected based on the reflectance of the reflective layer 120.

When the first medium 121 has thickness of 35 nm to 80 nm, the second medium 131 has thickness of 30 nm to 75 nm, and the number of pairs is 10 to 30, the reflective layer 120 can efficiently reflect light having wavelength of 300 nm to 700 nm.

The reflective layer 120 may be formed with a size identical to a light emitting area of the active layer 113, so that the reflection characteristics can be maximized and external light-emitting efficiency can be improved.

Figure 3:
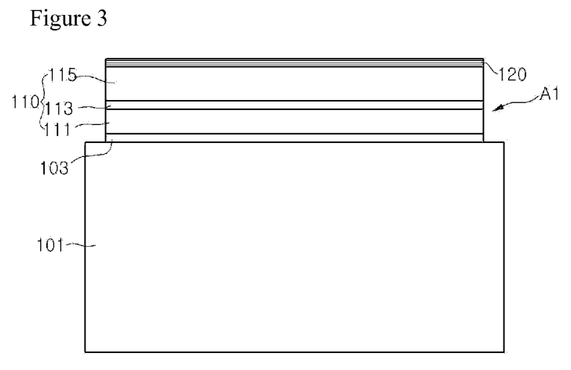

Referring to FIG. 3, after the reflective layer 120 is formed on the second conductive semiconductor layer 115, an outer peripheral portion A1 on the substrate 101 is removed using a mesa etching process.

Figure 4:
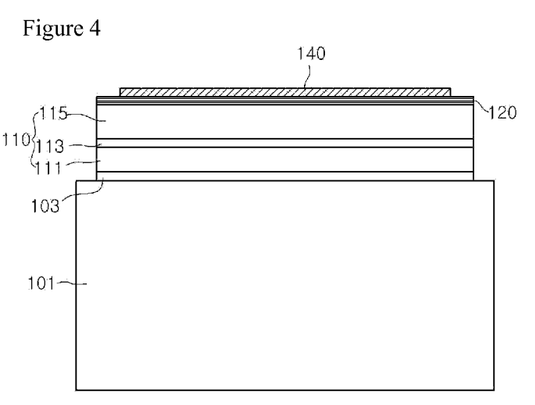

Referring to FIG. 4, the ohmic layer 140 is formed on the reflective layer 120. The ohmic layer 140 may comprise material having superior ohmic characteristics and low transmittance. For example, the ohmic layer 140 may comprise at least one selected from the group consisting of Pt, Ni, Au, Rh and Pd or a mixture thereof.

The ohmic layer 140 is formed on the upper surface of the reflective layer 120 so that the outer side of the ohmic layer 140 is not exposed to the sidewall of a device. Further, the ohmic layer 140 can be formed on the entire surface of the reflective layer 120.

Figure 5:
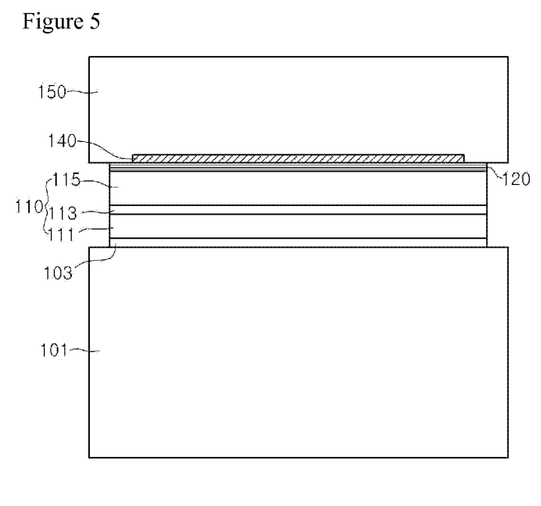

Referring to FIG. 5, after the ohmic layer 140 is formed, the conductive support member 150 may be formed on the ohmic layer 140. The conductive support member 150 may comprise copper, gold, carrier wafer (e.g. Si, Ge, GaAs, ZnO, SiC) and the like. For example, the conductive support member 150 may be formed using plating or wafer bonding technology. The scope of the present invention is not limited thereto. The ohmic layer 140 and the conductive support member 150 serve as the second electrode layer.

Figure 6:
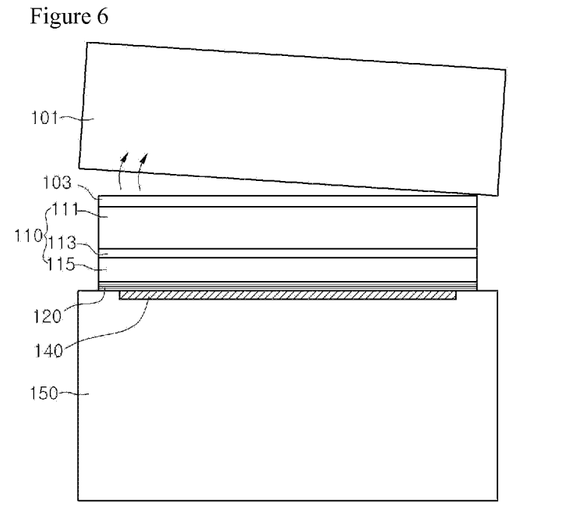
Figure 7:
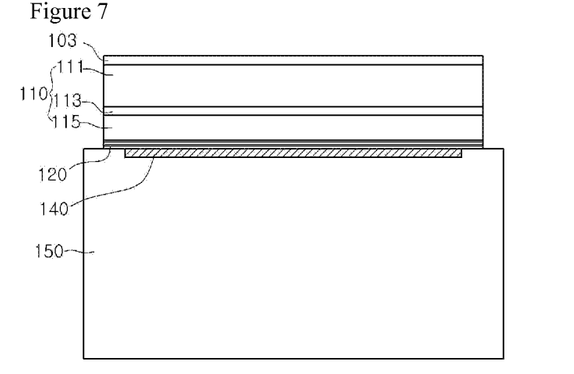

Referring to FIGS. 6 and 7, if the conductive support member 150 is formed, the conductive support member 150 serves as a base, so that the substrate 101 can be removed. The substrate 101 can be removed using a physical method and/or a chemical method. According to the physical method, the substrate 101 is separated using an LLO (laser lift off) scheme of irradiating laser having predetermined wavelength onto the substrate 101. According to the chemical method, the buffer layer 103 is removed by injecting etchant solution into the buffer layer 103 so that the substrate 101 can be separated.

After the substrate 101 is removed, a process of removing Ga oxide relative to the surface of the buffer layer 103 is performed. The process may not be performed.

Figure 8:
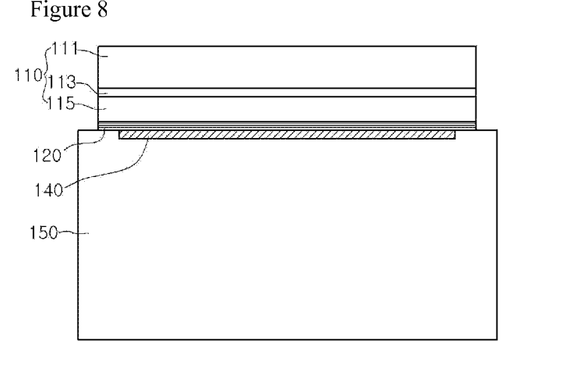

Referring to FIGS. 7 and 8, the buffer layer 103 is removed. The buffer layer 103 can be removed using a dry etching process, a wet etching process or a polishing process. At this time, if the buffer layer 103 is doped with a conductive dopant, the buffer layer 103 may not be removed.

Figure 9:
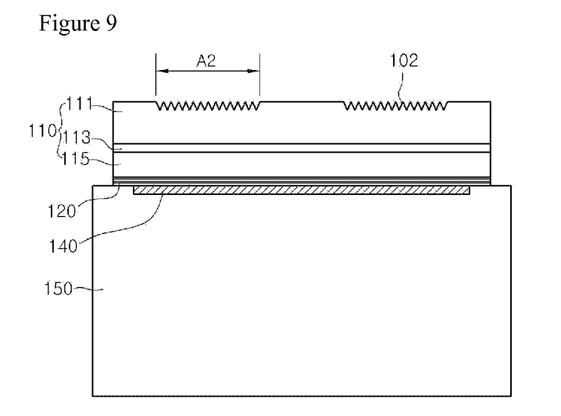
Figure 10:
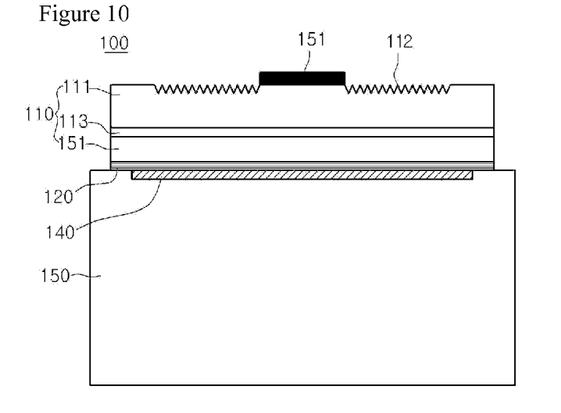

Referring to FIGS. 9 and 10, the roughness 112 may be formed on a part A2 of the upper surface of the first conductive semiconductor layer 111, or on the entire surface of the first conductive semiconductor layer 111.

The roughness 112 may have a concave-convex shape using a dry etching method, and the concave-convex shape may be changed. The roughness 112 may not be formed.

The first electrode 151 having a predetermined pattern is formed on the upper surface of the first conductive semiconductor layer 111.

Figure 11:
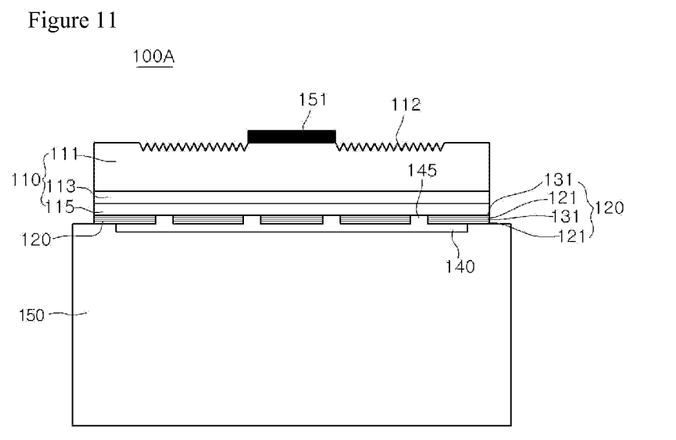
FIG. 11 is a side sectional view illustrating a semiconductor light emitting device according to a second embodiment.

FIG. 11 is a side sectional view illustrating a semiconductor light emitting device according to a second embodiment. In the second embodiment, the description about elements and functions identical to those of the first embodiment will be omitted in order to avoid redundancy.

Referring to FIG. 11, in the semiconductor light emitting device 100A, the reflective layer 120 having a plurality of island shape is formed under the second conductive semiconductor layer 115, and the ohmic layer 140 is formed under the reflective layer 120 and the second conductive semiconductor layer 115. Herein, the reflective layer 120 may be formed with a concave-convex shape.

The reflective layer 120 be formed under the second conductive semiconductor layer 115 of the light emitting structure 110, and a convex section 145 of the ohmic layer 140 is formed between the islands of the reflective layer 120.

The reflective layer 120 and the convex section 145 of the ohmic layer 140 may be formed on the lower surface of the second conductive semiconductor layer 115.

As disclosed above, in the embodiments, the thickness of the first medium 121 or the second medium 131 and the number of pairs of the first medium 121 and the second medium 131 are adjusted according to the wavelength of light emitted from the light emitting device, so that high reflectance can be provided. The reflective layer 120 has high reflection characteristics in a wavelength range of 300 nm to 700 nm.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Reference about the term "on" or "under" of each layer will be described with reference to the accompanying drawings.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiment can provide a vertical semiconductor light emitting device.

The embodiment can improve external light-emitting efficiency.

The embodiment can improve the reliability of a semiconductor light emitting device.

What is claimed is:

1. A semiconductor light emitting device having a reflective layer comprising:
   a light emitting structure including a first conductive semiconductor layer, a second conductive semiconductor layer under the first conductive semiconductor layer, and an active layer between the first conductive semiconductor layer and the second conductive semiconductor layer;
   an electrode on a first region of the first conductive semiconductor layer;
   a conductive support member under the light emitting structure;
   a metal layer between the light emitting structure and the conductive support member; wherein a bottom part of the metal layer is formed in the conductive support member and
   the reflective layer between the metal layer and the light emitting structure,
   wherein the metal layer is physically contacted with a lower surface of the reflective layer,
   wherein the reflective layer includes a first layer and a second layer,
   wherein the first layer has a different material from the second layer,
   wherein the metal layer has a protrusion on the conductive support member,
   wherein the first conductive semiconductor layer includes a roughness formed on an upper surface of the first conductive semiconductor layer, and
   wherein the first region is formed with a flat surface.

2. The semiconductor light emitting device as claimed in claim 1, wherein the first layer and the second layer have different refractive indexes from each other.

3. The semiconductor light emitting device as claimed in claim 1, wherein the reflective layer has a flat lower surface.

4. The semiconductor light emitting device as claimed in claim 1, wherein the reflective layer has a recess and the protrusion of the metal layer is disposed into the recess of the reflective layer.

5. The semiconductor light emitting device as claimed in claim 4, wherein the protrusion protrudes from the metal layer.

6. The semiconductor light emitting device as claimed in claim 1, wherein the roughness of the first conductive semiconductor layer is disposed on a second region different from the first region in the upper surface of the first conductive semiconductor layer.

7. The semiconductor light emitting device as claimed in claim 6, wherein the first and second semiconductor layers include a nitride-based material.

8. The semiconductor light emitting device as claimed in claim 1, wherein the conductive support member has a width wider than that of the reflective layer and has a thickness thicker than that of the metal layer.

9. The semiconductor light emitting device as claimed in claim 8, wherein the first and second layers are formed with the same thickness.

10. The semiconductor light emitting device as claimed in claim 8, wherein the metal layer has a different width from the width of the reflective layer.

11. The semiconductor light emitting device as claimed in claim 1, wherein at least one of the first layer and the second layer is formed of a different material from the second conductive semiconductor layer.

12. The semiconductor light emitting device as claimed in claim 11, wherein the first layer and the second layer is formed of a different material from a material of the metal layer.

13. The semiconductor light emitting device as claimed in claim 12, wherein the metal layer comprises at least one of Pt and Pd.

14. The semiconductor light emitting device as claimed in claim 13, wherein the conductive support member includes Cu material.

15. A semiconductor light emitting device having a reflective layer comprising:
   a light emitting structure including a first conductive semiconductor layer, a second conductive semiconductor layer under the first conductive semiconductor layer, and an active layer between the first conductive semiconductor layer and the second conductive semiconductor layer;
an electrode on a first region of a top surface of the first conductive semiconductor layer;
a conductive support member formed of a metal under the light emitting structure;
a metal layer between the light emitting structure and the conductive support member; wherein a bottom part of the metal layer is formed in the conductive support member;
wherein the metal layer has a protrusion on the conductive support member, and
the reflective layer between the metal layer and the light emitting structure,
wherein the light emitting structure includes a nitride-based material,
wherein the metal layer is physically contacted with a lower surface of the reflective layer,
wherein the reflective layer includes a first layer and a second layer,
wherein the first layer has a different refractive index from the second layer, and
wherein the conductive support member has a width wider than that of the reflective layer and has a thickness thicker than that of the metal layer.

16. The semiconductor light emitting device as claimed in claim 15, wherein the first layer has thickness of 35 nm to 80 nm and the second layer has thickness of 30 nm to 75 nm.

17. The semiconductor light emitting device as claimed in claim 15, wherein the first conductive semiconductor layer includes an AlGaN-based semiconductor layer and the second conductive semiconductor layer includes an AlGaN-based semiconductor layer.

18. The semiconductor light emitting device as claimed in claim 15, comprising roughness disposed on a second region of the top surface of the first conductive semiconductor layer.

19. The semiconductor light emitting device as claimed in claim 18, wherein the first region is formed with a flat surface.

20. The semiconductor light emitting device as claimed in claim 18, wherein at least one of the first layer and the second layer is formed of a different material from the second conductive semiconductor layer and the metal layer.

* * * * *

UNITED STATES PATENT AND TRADEMARK OFFICE
CERTIFICATE OF CORRECTION

PATENT NO. : 8,618,571 B2  
APPLICATION NO. : 13/560812  
DATED : December 31, 2013  
INVENTOR(S) : Hyung Jo Park Page 1 of 1

It is certified that error appears in the above-identified patent and that said Letters Patent is hereby corrected as shown below:

ON THE TITLE PAGE:

At item (63), correct the Related U.S. Application Data to read:

--Continuation of application No. 12/743,197, filed as PCT/KR2008/006947 on Nov. 25, 2008, now Pat. No. 8,253,156.--

IN THE SPECIFICATION:

At column 1, correct the first full paragraph at lines 7-13 to read as follows:

--The present application is a continuation of U.S. patent application Ser. No. 12/743,197, filed May 14, 2010, now U.S. Pat. No. 8,253,156. U.S. patent application Ser. No. 12/743,197 is the national phase from International Application No. PCT/KR2008/006947, filed on Nov. 25, 2008, which claims priority under 35 U.S.C. 119 to Korean Patent Application No. 10-2007-0120649 (filed on Nov. 26, 2007), all of which are hereby incorporated by reference in their entirety.--

Signed and Sealed this
Seventeenth Day of June, 2014

Michelle K. Lee
*Deputy Director of the United States Patent and Trademark Office*